US009799598B2

(12) United States Patent
Eymard

(10) Patent No.: US 9,799,598 B2
(45) Date of Patent: Oct. 24, 2017

(54) METHOD FOR PRODUCING AN ELECTRONIC CHIP SUPPORT, CHIP SUPPORT AND SET OF SUCH SUPPORTS

(71) Applicant: Linxens Microtech, Vorey (FR)

(72) Inventor: Eric Eymard, Aiguilhe (FR)

(73) Assignee: Linxens Holding, Mantes-la-Jolie (FR)

( * ) Notice: Subject to any disclaimer, the term of this patent is extended or adjusted under 35 U.S.C. 154(b) by 0 days.

(21) Appl. No.: 15/036,927

(22) PCT Filed: Nov. 18, 2014

(86) PCT No.: PCT/FR2014/052955
§ 371 (c)(1),
(2) Date: May 16, 2016

(87) PCT Pub. No.: WO2015/071619
PCT Pub. Date: May 21, 2015

(65) Prior Publication Data
US 2016/0293536 A1    Oct. 6, 2016

(30) Foreign Application Priority Data
Nov. 18, 2013    (FR) ...................... 13 61300

(51) Int. Cl.
*H01L 23/02*    (2006.01)
*H01L 23/498*    (2006.01)
(Continued)

(52) U.S. Cl.
CPC ...... *H01L 23/49855* (2013.01); *H01L 21/486* (2013.01); *H01L 23/49827* (2013.01);
(Continued)

(58) Field of Classification Search
USPC ......... 257/621, 774, E21.597; 438/629, 630, 438/637–640, 668, 672, 675
See application file for complete search history.

(56) References Cited

U.S. PATENT DOCUMENTS 6,310,778 B1   10/2001   Finn et al. ................... 361/737
6,522,014 B1    2/2003   Egitto et al. .................. 257/774
(Continued)

FOREIGN PATENT DOCUMENTS

DE    10 2006 019 925 A1    10/2007
EP     0 671 705 B1          10/2003
(Continued)

*Primary Examiner* — Tram H Nguyen
(74) *Attorney, Agent, or Firm* — Harrington & Smith

(57) ABSTRACT

Method for producing at least one electronic chip support, from a plate that includes a first face intended to be in contact with a chip reader, a second face, covered with a first layer of electrically conductive material and intended to be linked to a radio antenna, and a core made from an electrically insulating material separating the first face from the second face. This method includes steps of drilling at least one through hole through the plate, depositing a layer of electrically conductive material on the first face and chemically etching a first electric circuit and a second electric circuit on the first face and the second face respectively. Prior to the chemical etching step, a step of depositing a third layer of electrically conductive material in the hole or holes, which covers the electrically insulating material in the corresponding hole or holes.

13 Claims, 8 Drawing Sheets

(51) Int. Cl.
*H01L 21/48* (2006.01)
*H01L 23/66* (2006.01)

(52) U.S. Cl.
CPC ........ *H01L 23/49838* (2013.01); *H01L 23/66* (2013.01); *H01L 2223/6677* (2013.01); *H01L 2924/0002* (2013.01)

(56) References Cited

U.S. PATENT DOCUMENTS

| | | | |
|---|---|---|---|
| 8,710,645 B2* | 4/2014 | Shau | H01L 21/561 257/693 |
| 2006/0139901 A1 | 6/2006 | Meireles et al. | 361/760 |
| 2007/0170564 A1 | 7/2007 | Drummer et al. | 257/678 |
| 2014/0353384 A1* | 12/2014 | Hoegerl | G06K 19/07707 235/488 |
| 2015/0278675 A1* | 10/2015 | Finn | B23K 26/361 235/492 |

FOREIGN PATENT DOCUMENTS

| | | |
|---|---|---|
| FR | 2 810 768 A1 | 12/2001 |
| FR | 2 880 160 A1 | 6/2006 |

\* cited by examiner

METHOD FOR PRODUCING AN ELECTRONIC CHIP SUPPORT, CHIP SUPPORT AND SET OF SUCH SUPPORTS

The present invention relates to a method for manufacturing an electronic chip support. The invention also relates to such an electronic chip support and a set of such electronic chip supports.

In the field of supports for electronic chips, it is known practice to produce a two-sided chip support, comprising a first side that is intended to be in contact with a chip reader and a second side, opposite the first side, that is intended to be connected to an RF antenna. Once the chip is connected to such a support, a terminal is able to establish communication with the chip, either via a contact on the first side, or contactlessly, via the RF antenna connected to the second side.

FIGS. 11 and 12 partially show a set 500 of chip supports 502 in accordance with the prior art. More specifically, FIG. 11 shows a side 504 of the set 500 corresponding to a first side 506 of each chip support 502. As for FIG. 12, it shows a side 508 of the set 500 corresponding to a second side 510 of each chip support 502.

The set 500 of chip supports comprises, along its width W500, two longitudinal edges 512 and 514 and two chip supports 502 between the two edges 512, 514. Furthermore, the set 500 comprises, along its length L500, a plurality of chip supports 502, of which three rows of two supports are visible in these figures.

Each chip support 502 extends, along the length L500 of the set 500, over a length L502 that is equal to 14.25 mm, also referred to as the "pitch" of the support 502.

On each of the sides 504, 508, the edges 512, 514 each comprise a power supply line 516a, 516b, 518a, 518b, also referred to as the "power supply chain", made of an electrically conductive material. The power supply lines 516a, 516b, 518a, 518b extend over the entire length L500 of the set 500 and are able to supply electrical power to the corresponding sides 504, 508.

Each first side 506 comprises a first electrical circuit 520 that is intended to be in contact with a chip reader and connected to the power supply chains 516a, 516b. Each second side 510 comprises a second electrical circuit 522 that is intended to be connected to an RF antenna and connected to the power supply chains 518a, 518b. The chains 516a, 516b allow each first circuit 520 to be supplied with current in order to carry out an electrodeposition of material, such as gold, on each first circuit 520. The chains 518a, 518b allow each second circuit 522 to be supplied with current in order to carry out an electrodeposition of material, such as gold, on each second circuit 522.

Each first electrical circuit 520 comprises lands for contact 524 with the chip reader. The contact lands 524 are covered by a conductive metal, such as copper, and comprise, under the conductive metal, orifices 526 ending on each second side 510.

Each second electrical circuit 522 comprises two points for connection 528, 530 to the RF antenna.

During the fixation of a chip to each support 502 and, more specifically, to the corresponding second side 510, in order to allow the connection between the chip reader and the chip, wires are connected between this chip and the contact lands 524 and pass through the corresponding orifices 526.

During the manufacturing of the set 500 or, more specifically, of one of the supports 502, in order to carry out steps of electrodeposition of, for example, gold on the first 520 and the second 522 electrical circuits, which are generally made of copper, it is necessary to supply electrical power to the corresponding first 506 and second 510 support sides 502, i.e. the first 520 and second 522 electrical circuits, via the respective chains 516a, 516b and 518a, 518b. Furthermore, during the manufacturing of the supports 502, the diameter of the orifices 526 must be sufficient to allow the wires for connection between the contact lands 524 and the electronic chip to pass through. Additionally, the connection of each wire with the associated contact land 524 is carried out inside the corresponding orifice 526, thereby implying the use of a relatively substantial length of wire between the chip and the contact land 524. In a variant, the wire is connected inside the orifice between the contact land and a ring, made of a conductive material, that is positioned on the second side 510, around the orifice 526, then a connection is made between the chip and the ring. However, in such supports, the wires allowing each contact land 524 to be connected to the chip, and likewise the orifices 526, occupy a large volume. As the second side comprises the points for connection 528, 530 to the RF antenna, the dimensions of the second electrical circuit 522 are such that the length L502 of each chip support 502 is of the order of 14.25 mm, or greater than 14.25 mm. Specifically, according to the standards in force for chip supports, such as ISO/IEC standard 7816-2:2007, the length of a chip support must be a multiple of 4.75 mm, thereby implying a chip support with possible dimensions of 4.75 mm, 9.5 mm, 14.25 mm, etc. Additionally, the chip supports 502 comprise electrical power supply chains on both sides, thereby implying, in the gold electrodeposition steps, that the gold is electrodeposited on each of the chains 516a, 516b, 518a, 518b. This results in a higher manufacturing cost.

The aim of the invention is to propose a chip support comprising a first side for contact with a chip reader and a second side for connection with an RF antenna, with which the connection of electronic chips is facilitated and the manufacturing cost of which is reduced.

To this end, a subject of the invention is a method for manufacturing at least one electronic chip support, this support being manufactured on the basis of a wafer comprising a first side intended to be in contact with a chip reader, a second side, opposite the first side, covered by a first layer of electrically conductive material and intended to be connected to an RF antenna, and a core made of an electrically insulating material separating the first side from the second side, the method comprising the following steps:
  a) the drilling of at least one through-orifice through the wafer, along a direction that is perpendicular to the wafer;
  b) the deposition of a second layer of electrically conductive material on the first side, the second layer being suitable for covering the orifice or orifices; and
  c) the chemical etching of first and second electrical circuits on the first side and the second side, respectively.

In accordance with the invention, the method comprises, prior to the chemical etching step, the following step:
  b1) the deposition of a third layer of conductive material in the orifice or orifices, the third layer being made of an electrically conductive material that is suitable for covering the electrically insulating material of the core in the corresponding orifice or orifices, the third layer of electrically conductive material electrically connecting, subsequent to the chemical etching step c), the first and the second electrical circuits.

By virtue of the invention, the third layer of conductive material allows the orifice or orifices and, more specifically, the insulating material inside the orifice to be electrically sensitized, in order to connect the first and the second electrical circuits. Additionally, by virtue of the invention, each orifice makes the connection between the first side and the second side and, during the connection of the chip to the second side, it is sufficient to solder a very small wire between the chip and parts of the second electrical circuit that are electrically connected to the orifices. Thus, the size of the land for connection between the chip and the first and second electrical circuits is miniaturized, this allowing a chip support whose pitch is equal to 9.5 mm to be produced.

According to other advantageous aspects of the invention, the manufacturing method furthermore comprises one or more of the following features, taken in isolation or according to any technically permissible combinations:

Subsequent to the deposition step b) and prior to the chemical etching step c), the method comprises the following step b2): the electrodeposition of a fourth layer of electrically conductive material on the second side and inside each orifice, via the connection of only one of the two sides to an electrical power supply source.

Subsequent to the etching step, the method comprises the following steps d) and e): the electrodeposition of a fifth layer of electrically conductive material on the first side, and the electrodeposition of a sixth layer of electrically conductive material on the second side, where the steps of electrodeposition of the fifth and sixth layers are carried out via the connection of the first and the second electrical circuits to an electrical power supply source only on the side of the first electrical circuit 32.

In the step of electrodeposition of the fifth layer, a first single-sided electrolysis is carried out, the second side being masked by a first masking member, while in the step of electrodeposition of the sixth layer, a second single-sided electrolysis is carried out, the first side being masked by a second masking member.

Prior to the electrodeposition of the fifth and of the sixth layer, a layer of nickel is electrodeposited on at least one of the third and fourth layers.

The third layer is made of a carbon-based material.

The fifth and sixth layers of electrically conductive material are made of a gold-based material.

In the drilling step, first and second orifices are drilled, the first orifices being drilled in the vicinity of a land or lands for contact of a chip reader with the first side, and the second orifices being drilled outside the contact land or lands, whereas, subsequent to the etching step, the second electrical circuit comprises two points for connection to the RF antenna and an electrical continuity is maintained between each second orifice and the corresponding connection point.

Subsequent to the etching step, the second electrical circuit comprises a land or lands for connecting with the chip, each connecting land being electrically connected, via the fourth layer, to a corresponding second orifice.

Another object of the invention is an electronic chip support, this support comprising a wafer comprising at least one orifice passing through the wafer, along a direction that is perpendicular to the wafer, a first side comprising a first electrical circuit and intended to be in contact with a chip reader, the first electrical circuit covering the orifice or orifices on the first side, a second side, opposite the first side, comprising a second electrical circuit and intended to be connected to an RF antenna, a core made of an electrically insulating material separating the first side from the second side. In accordance with the invention, a layer of electrically conductive material is placed in the orifice or orifices, the layer of electrically conductive material covering the electrically insulating material in the corresponding orifice or orifices and electrically connecting the first circuit and the second circuit.

According to other advantageous aspects of the invention, the support furthermore comprises one or more of the following features, taken in isolation or according to any technically permissible combinations:

the first side forms a quadrilateral, where the shortest edge of the quadrilateral has a length that is equal to 9.5 mm with a margin of error of 2%.

the second electrical circuit comprises a land or lands for connecting with the chip, each connecting land being electrically connected to a corresponding orifice.

Another object of the invention is a set of chip supports, this set comprising, along its width, two edges and at least two chip supports between the two edges and such as mentioned above.

Advantageously, the set comprises, solely on one side, corresponding to the first or to the second side, at least one electrical power supply line extending along the length of the set and electrically connected to each corresponding electrical circuit, either by means of branches or by means of at least one layer of conductive material placed in the orifice or orifices.

The invention will be better understood and other advantages thereof will become more clearly apparent in the light of the description which follows, given solely by way of non-limiting example and with reference to the appended drawings in which.

Figure 1:
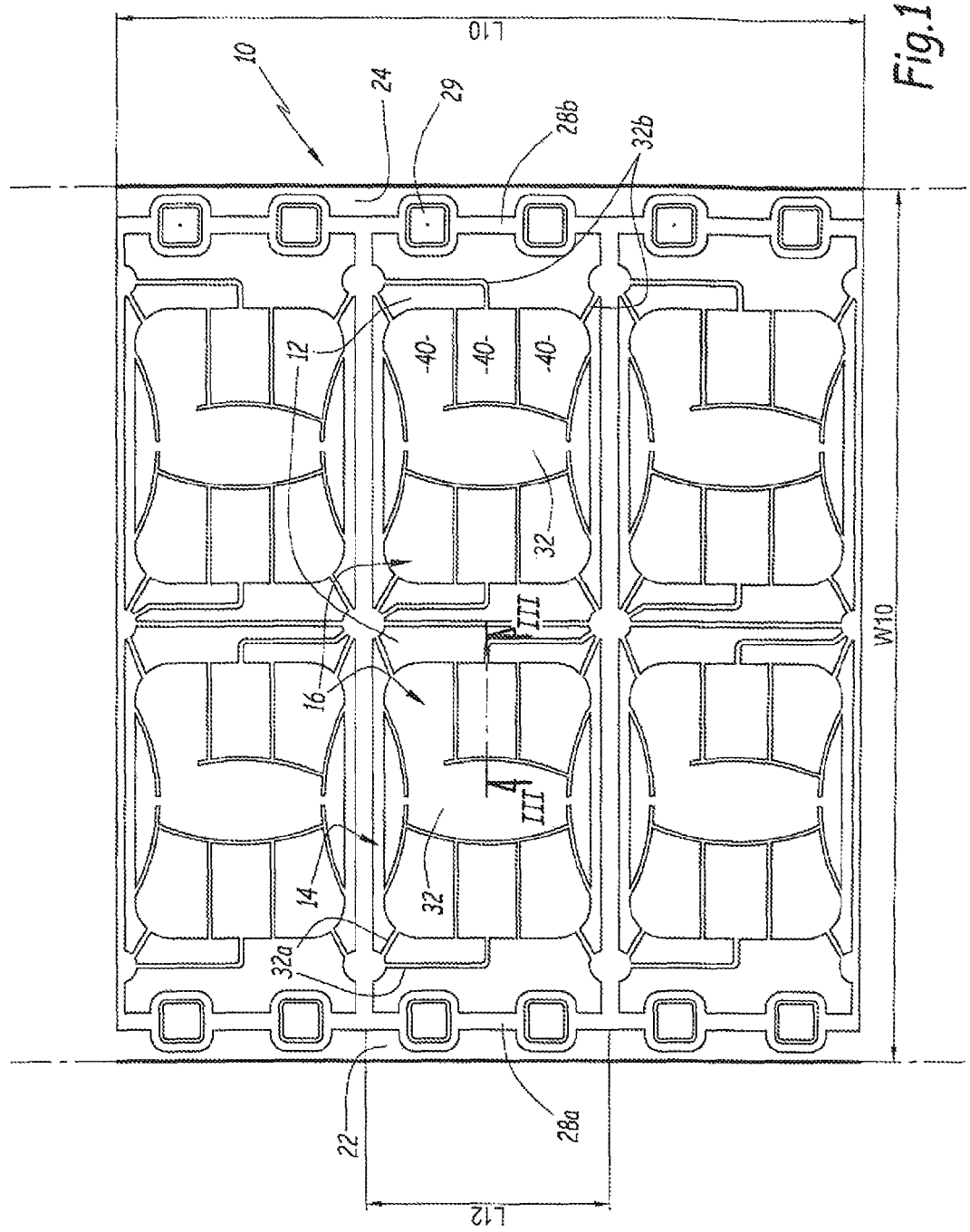
FIG. 1 is a partial plan view of a first side of a set of chip supports in accordance with a first embodiment of the invention.
Figure 2:
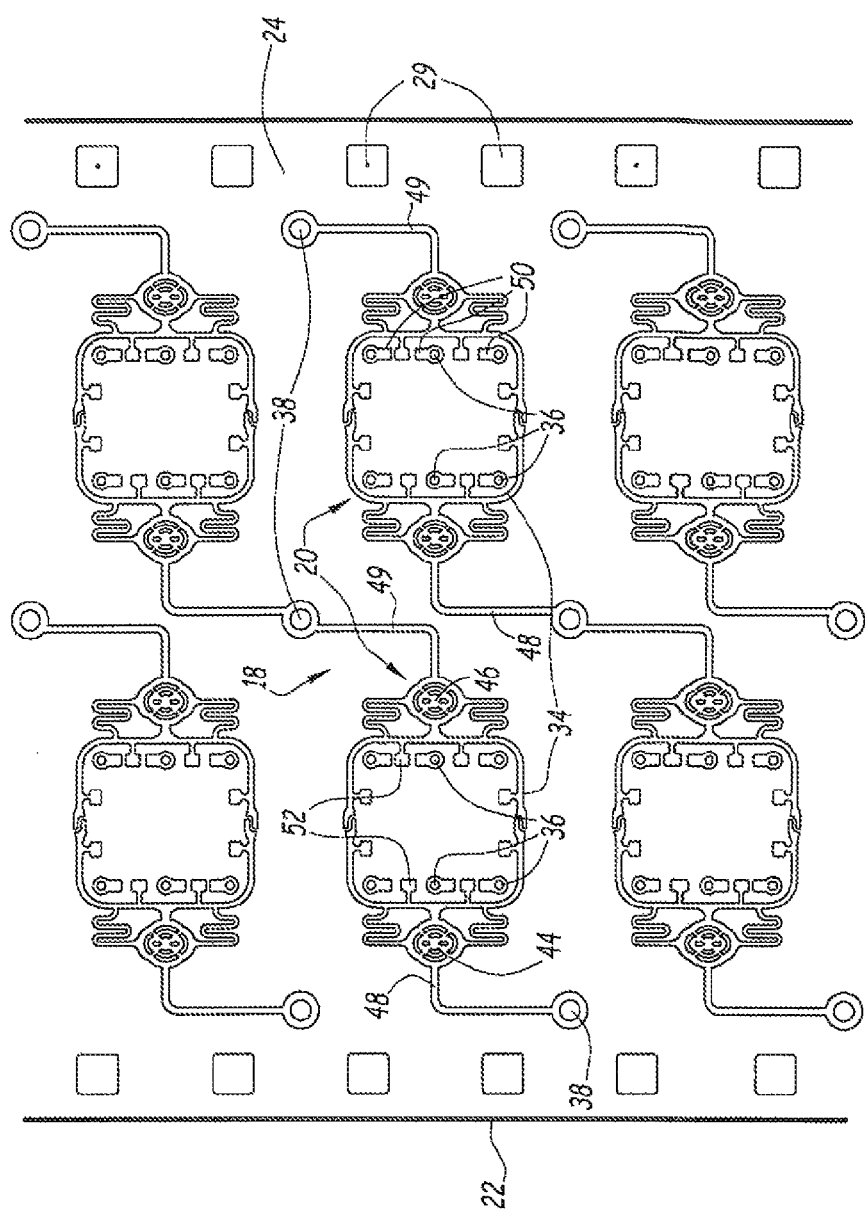
FIG. 2 is a partial plan view of a second side, opposite the first side, of the set of chip supports of FIG. 1.

In FIGS. 1 and 2, a set 10 of chip supports comprises six chip supports 12. More specifically, FIG. 1 shows a side 14 of the set 10 corresponding to a first side 16 of each chip support 12. FIG. 2 shows a side 18 of the set 10 corresponding to a second side 20 of each chip support 12, opposite its first side 16.

The set 10 of chip supports forms a strip that comprises, along a transverse dimension of the set 10, i.e. along its width W10, rows of two supports 12 that are arranged one after the other along a longitudinal dimension of the set 10, i.e. along its length L10. In practice, and as shown by the axis lines that extend from the set 10 in FIGS. 1 and 2, the set 10 comprises many tens or hundreds of rows of two supports 12, one behind the other along the length L10 of the set 10. The set 10 comprises, along its width W10, two edges 22 and 24 and each row of two supports is between the two edges 22 and 24.

The rest of the description is focused on the central row of two supports 12 that are visible in FIGS. 1 and 2 but is applicable to the other rows of two supports 12.

Each chip support 12 extends over a length L12 that is equal to 9.5 mm, also referred to as the pitch of the support 12.

Each chip support 12 comprises a wafer 26 forming the first side 16 and the second side 20.

In practice, the wafers 26 of each support 12 form a single continuous strip whose width extends between the edges 22 and 24 and whose length extends over many meters and, more specifically, over a length corresponding to the length L10 of the set 10.

On the side 14 and hence on each of the first sides 16, the edges 22, 24 each comprise a power supply line or "power supply chain" 28a, 28b made of an electrically conductive material, such as copper. The power supply lines 28a, 28b extend over the entire length L10 of the set 10 and are able to supply electrical power to the side 14. The power supply lines 28a, 28b are positioned around holes 29 passing through the chip supports 12 and the wafer 26. The holes 29 are intended to accommodate members that are suitable for moving the set 10 parallel to its length L10 along a line for manufacturing the set 10, such as drive fingers.

Each first side 16 comprises a first electrical circuit 32 that is intended to be in contact with a chip reader and connected to the corresponding power supply lines 28a, 28b by branches 32a and 32b.

Each second side 20 comprises a second electrical circuit 34 that is intended to be connected to an RF antenna (not shown).

Figure 5:
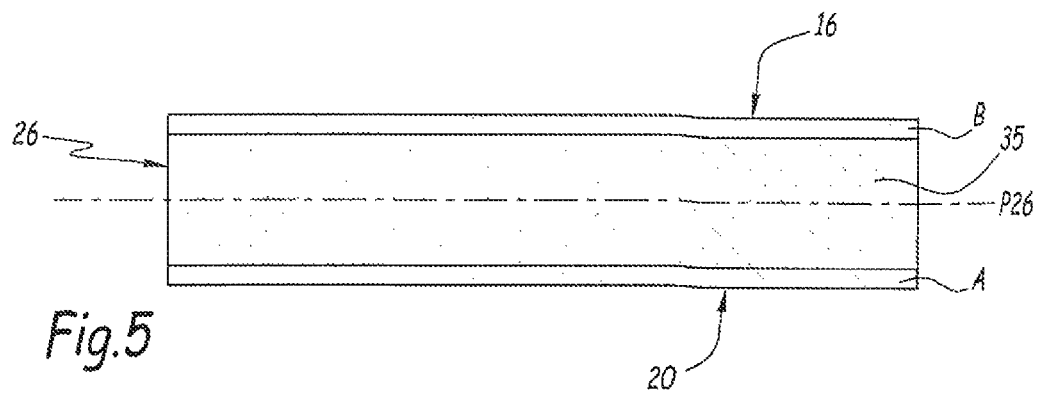
FIG. 5 is a cross section, analogous to FIG. 3, of a wafer used in the manufacturing of the chip support of FIG. 3.

Each wafer 26 comprises, prior to the manufacturing of the corresponding support 12 and as shown in FIG. 5, a first layer A of conductive material on the second side 20 and a layer B of adhesive on the first side 16, as well as a core 35 made of an electrically insulating material separating each first side 16 from the corresponding second side 20. The electrically insulating material is preferably glass-epoxy.

Figure 3:
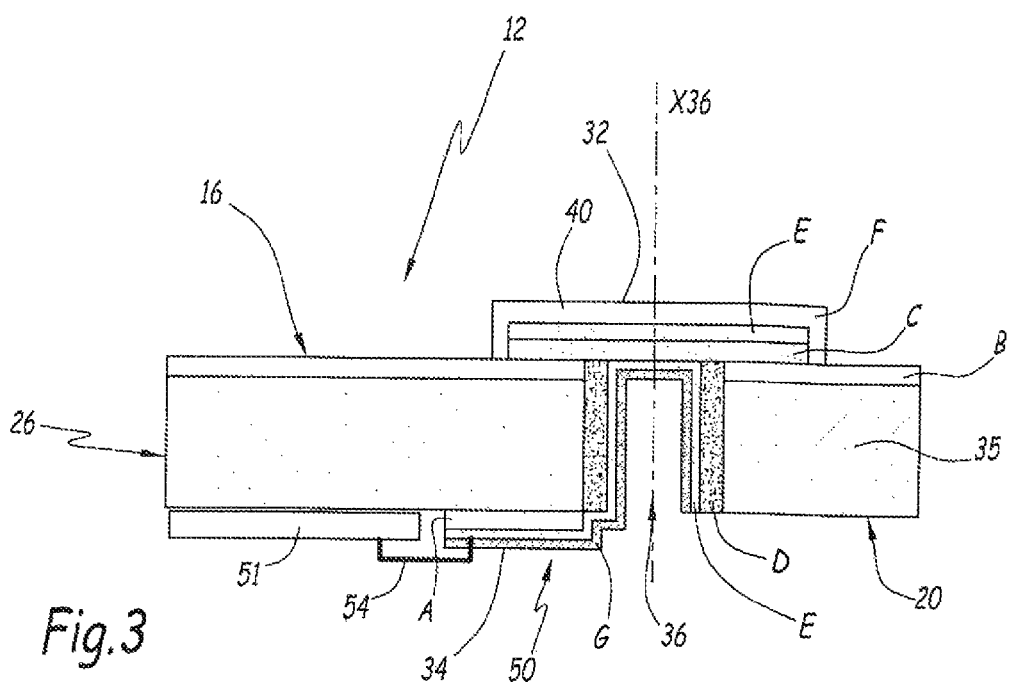
FIG. 3 is a partial cross section, along a plane III in FIG. 1, of one of the chip supports of FIG. 1 connected to a chip.

Each wafer 26 comprises six first orifices 36 and two second orifices 38 passing therethrough in a direction that is perpendicular to the wafer. More specifically, the six first orifices 36 and the two second orifices 38 are, on the one hand, open on the second side 20 and, on the other hand, covered on the first side 16 by a second layer C of electrically conductive material. As shown in FIG. 3 for one of the first orifices 36, each first orifice 36 comprises, on its lateral walls at the level of the core 35 and the layer of adhesive, a third layer D of electrically conductive material covered by a fourth layer E of electrically conductive material.

Each first electrical circuit 32 comprises lands 40 for contact with a chip reader. As shown in FIG. 3, the contact lands 40 are located on the first side 16 and cover the first orifices 36. The contact lands 40 comprise, from the first orifice 36 outward, the second layer C, along with the fourth layer E of electrically conductive material and a fifth layer F of electrically conductive material. In addition, the second layer C is in contact with the third layer D and the fourth layer E at the level of the first orifices 36.

More generally, the first circuit 32 comprises the second layer C, along with the fourth layer E and the fifth layer F.

The second electrical circuit 34 comprises two points for connection 44 and 46 to the RF antenna. The second circuit 34 comprises the first layer A, along with the fourth layer E and a sixth layer G made of an electrically conductive material. The sixth layer G is also placed inside each first orifice 36 and covers the fourth layer E in each orifice 36.

The second orifices 38 comprise the same layers as the first orifices 36. The second orifices 38 are positioned through each wafer 26, outside the contact lands 40, and are covered at the level of the first side 16 by the first electrical circuit 32.

Advantageously, the second circuit 34 and the first 36 and second 38 orifices comprise, between the fourth E and the sixth G layers, a layer of nickel (not shown). Likewise, advantageously, the first circuit 32 comprises, between the fourth E and the fifth F layers, a layer of nickel (not shown). The nickel allows any diffusion of material between the fourth layer E and the fifth F and sixth G layers, respectively, to be avoided.

The power supply lines 28a, 28b are able to supply electrical power to each first electrical circuit 32 during, for example, the electrodeposition of the fourth layer E on the first side 16.

The third layer D of electrically conductive material is, for example, based on carbon and covers the electrically insulating material of the core 35 in each first 36 and second 38 orifices, in order to electrically connect the first circuit 32 and the second circuit 34. More specifically, the carbon allows the first 36 and second 38 orifices to be electrically sensitized. Thus, the first electrical circuit 32 is connected to the second electrical circuit 34 and, therefore, the contact lands 40 are connected to the second electrical circuit 34. The power supply lines 28a, 28b are thus able to supply electrical power, as well as to each first electrical circuit 32, to each second electrical circuit 34 through the circuit 32 and the third layer D.

The two points for connection 44, 46 to the corresponding RF antenna are electrically connected with one of the corresponding second orifices 38 by a corresponding electrical line 48, 49. Thus, an electrical continuity is maintained between each second orifice 38 and the associated connection point 44, 46. The connection between the connection points 44, 46 and the second orifices 38 allows the connection points 44, 46 to be supplied with electrical power, via the electrical lines 28a, 28b and the third and fourth layers present in the second orifices 38, for the electrodeposition of the sixth layer G on the connection points 44, 46.

Additionally, each second electrical circuit 34 comprises, in the vicinity of each first orifice 36 on the corresponding second side 20, a land for connecting 50 with a chip 51. Each connecting land 50 is electrically connected, via the fourth layer E, to one of the corresponding first orifices 36 that is positioned facing a corresponding contact land 40. Thus, each contact land 40 is electrically linked to a corresponding connecting land 50.

During the fixation of a chip 51 to one of the supports 12, the chip is fixed to the second side 20 and the connection points 44, 46 are connected to the chip via connecting points 52. More specifically, a wire (not shown) is connected between each connecting point 52 and the chip 51. Thus, the RF antenna is electrically connected to the chip 51 which is able to communicate contactlessly with a suitable chip reader.

During the fixation of the chip 51 to the support 12, the chip is also connected, via electrical wires of which one is visible in FIG. 3 with reference 54, to the connecting lands 50. The chip 51 is thereby able to communicate with the chip reader via contact with the first side 16 and, more specifically, with the contact lands 40 through the orifices 36.

The first A, second C and fourth E layers are made of a copper-based material.

The fifth layer F is a layer of gold allowing the first circuit 32 to be protected from oxidation and whose thickness measured perpendicularly to the wafer, i.e. along a central axis of the first orifices 36, is of the order of 0.1 micrometers (μm).

The sixth layer G is a layer of gold allowing, on the one hand, the first circuit 32 to be protected from oxidation and, on the other hand, the connection wires to be soldered to the chip on the connecting lands 50 and points 52. The thickness of the sixth layer G, measured perpendicularly to the wafer, is of the order of 0.35 μm. On the second circuit 34, and more specifically at the level of the connecting lands 50 and points 52, the thickness of gold must be sufficient for soldering a wire between the chip and the connecting lands 50 and points 52.

Figure 4:
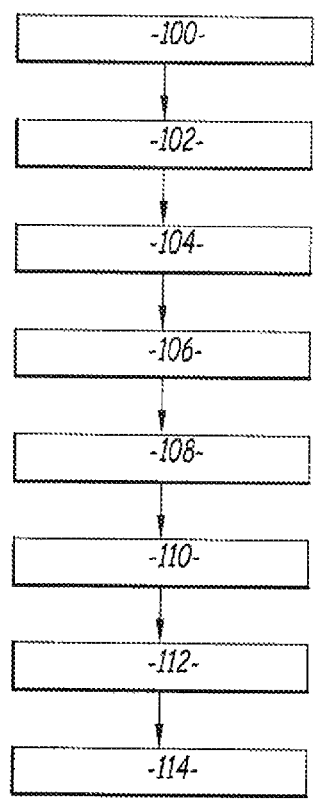
FIG. 4 is a flow diagram of a method for manufacturing the set of FIGS. 1 and 2.

In FIG. 4, a flow diagram of a method for manufacturing the set 10 is shown. In order to manufacture the chip supports 12, one wafer 26 is used for each support, the various wafers 26 forming, in practice, a continuous strip, as explained above. Initially, the wafer 26 comprises, as shown in FIG. 5, the first side 16 entirely covered by the layer of adhesive B and the second side 20 covered by the first layer A. The wafer 26 also comprises the core 35 that separates the first layer A and the layer of adhesive B, i.e. the first 16 and second 20 sides. The layer of adhesive B comprises, for example, epoxy adhesive.

In a first drilling step 100, the first 36 and second 38 orifices are drilled through the wafer 26, along a direction that is perpendicular to a main plane P26 of the wafer 26 which is equidistant from the sides 16 and 20. The first 36 and second 38 orifices pass through the wafer 26. The central axis X36 of an orifice 36, that is perpendicular to the plane P26, is visible in FIGS. 3, 6 and 7.

Then, in a subsequent step 102, the second layer C is deposited on the first side 16. More specifically, a sheet of copper is co-laminated onto the first side 16, i.e. onto the layer of adhesive B. The second layer C then covers the first 36 and second 38 orifices.

Next, in a step 104, the third layer D of conductive material is deposited in the first 36 and second 38 orifices. The third layer D is made of carbon and is suitable for covering the electrically insulating material of the core 35 in the first 36 and second 38 orifices. The third layer D then electrically connects the first side 16 and the second side 20.

Figure 6:
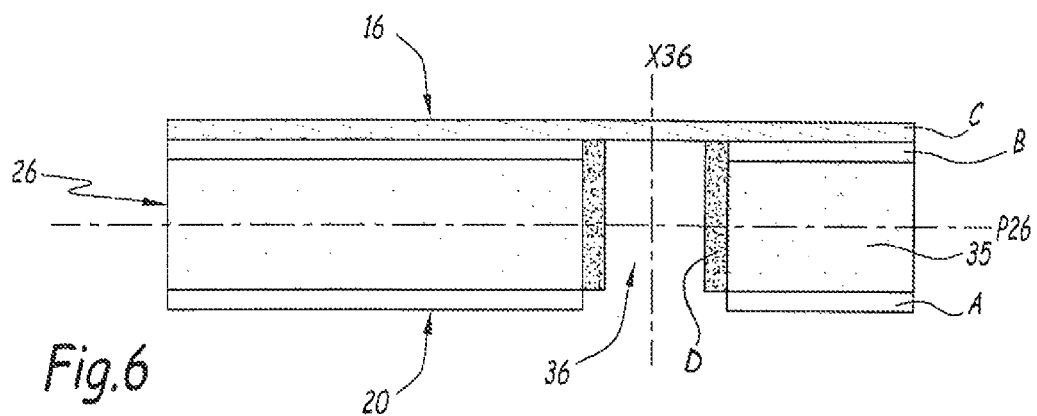
FIG. 6 is a cross section, analogous to FIG. 5, subsequent to the steps of drilling orifices and depositing second and third layers of conductive material.

The structure of the wafer 26 and, more specifically, of each chip support 12 subsequent to steps 100 to 104 is shown in FIG. 6.

In the course of a subsequent step 106, the fourth layer E of conductive material is electrodeposited on the second side 20 and inside the first 36 and second 38 orifices. In addition, the fourth layer E is also electrodeposited on the first side 16. In order to carry out this step 106 of electrodeposition of the fourth layer E, the power supply lines 28a, 28b are connected to an electrical power supply source, thereby allowing the first side 16 and, consequently, the second side 20 to be supplied with electrical power via the third layer D placed in the first 36 and second 38 orifices.

Figure 7:
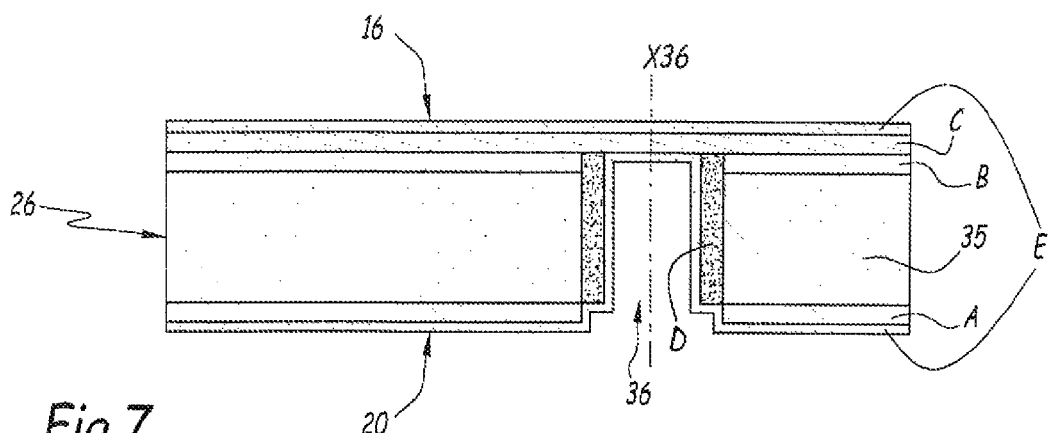
FIG. 7 is a cross section, analogous to FIG. 6, subsequent to the steps of electrodeposition of a fourth layer of conductive material.

The structure of the wafer 26 and, more specifically, of each chip support 12 subsequent to step 106 is shown in FIG. 7.

Then, in a step 108, the first 32 and the second 34 electrical circuits are chemically etched on the first side 18 and the second side 20, respectively. Subsequent to the etching step 108, the first electrical circuit 32 comprises the contact lands 40 and the second electrical circuit comprises the connecting lands 50 and points 52, along with the connection points 44, 46. The first electrical circuit 32 is connected to the power supply lines 28a, 28b by the branches 32a and 32b. Subsequent to the etching step, the first electrical circuit 32 forms a closed circuit, i.e. all of the contact lands 44 are mutually connected in order that, when the power supply lines 28a, 28b are connected to a source of electric current, this electric current flows through all of the first electrical circuit 32 and, consequently, the second circuit 34.

Furthermore, subsequent to the etching step 108, the connecting lands 50 are, on the second side 20, electrically isolated from one another, but all of them are connected to the first electrical circuit 32 via the first orifices 36 and the third D and fourth E layers. Likewise, the connection points 44, 46 are electrically connected to the first electrical circuit 32 via the second orifices 38 and the third D and fourth E layers.

Next, in the course of an optional step 110, a layer of nickel (not shown in the various figures) is electrodeposited on the first 32 and the second 34 electrical circuits and also in the first 36 and second 38 orifices. The electrodeposition of the nickel allows a diffusion barrier to be made between the copper and the fifth F and sixth G layers. The electrodeposition is carried out by virtue of the supply of electrical power from the power supply lines 28a, 28b.

In a variant, the layer of nickel is electrodeposited either solely on the first electrical circuit 32, or solely on the second electrical circuit 34 and inside the first 36 and second 38 orifices.

Next, in the course of a step 112, the fifth layer F of conductive material is electrodeposited on the first electrical circuit 32. The fifth layer F is made of gold, a material that is resistant to oxidation and friction in comparison with copper. In order to carry out the electrodeposition of the fifth layer, a first single-sided electrolysis is carried out. Namely, the first electrical circuit 32 is supplied with electrical power via the power supply lines 28a, 28b, while the second side 20 is masked by a masking member.

Figure 8:
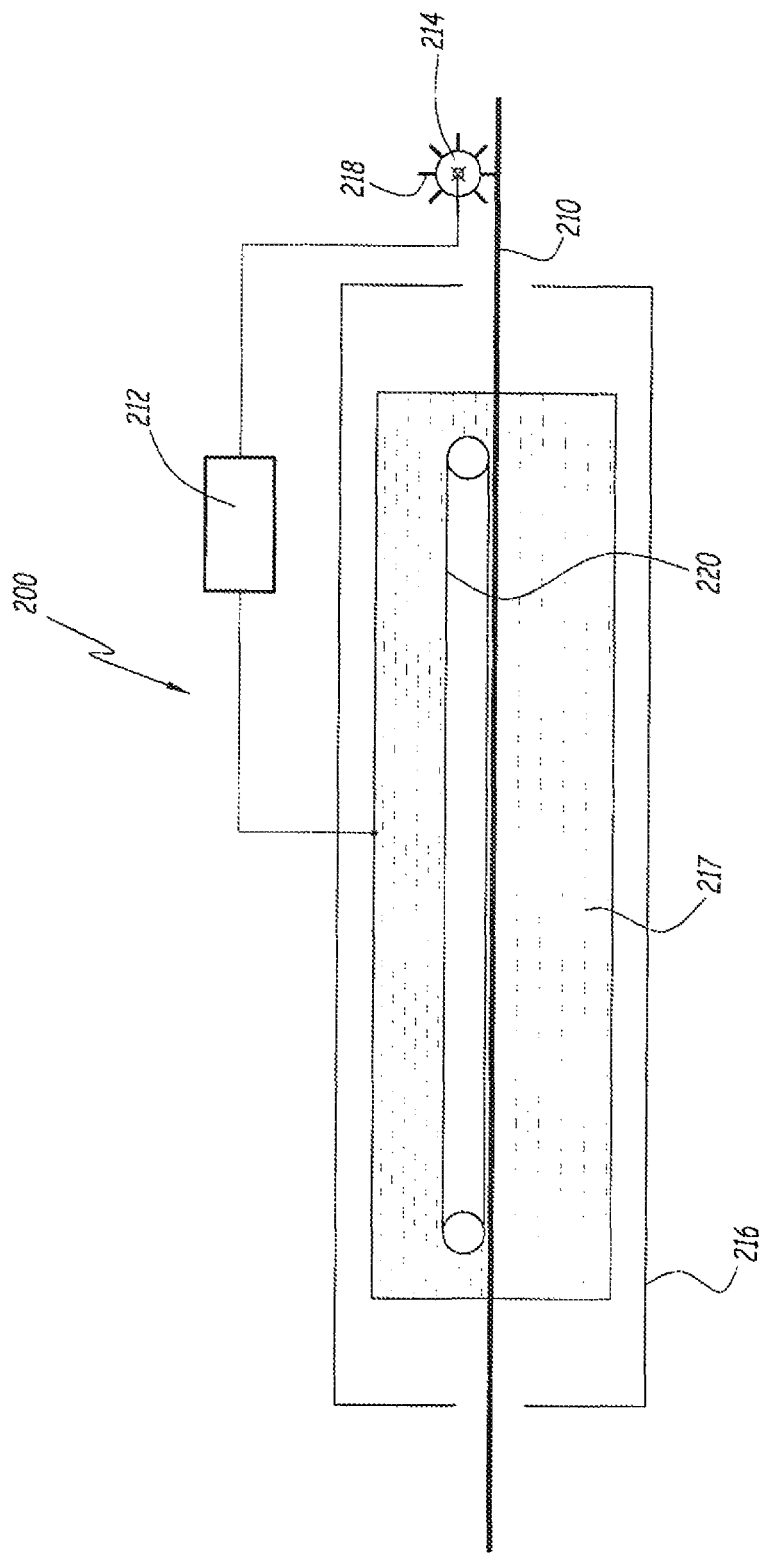
FIG. 8 is a plan view of a single-layer electrolysis setup used in the steps of electrodeposition of fifth and sixth layers of conductive materials.

A setup 200 allowing this one-sided electrolysis to be carried out is shown in FIG. 8. The setup 200 comprises a strip 210 that corresponds to a plurality of set 10 joined one after the other along their length over a distance of many meters. The strip 210 thus comprises a plurality of supports 12, and hence wafers 26, on which the electrodeposition of the fifth layer F has not yet been carried out. The setup 200 also comprises a current generator 212 that is able to supply power to the first electrical circuits 32, a member 214 for moving the set 10 and a cell 216 through which the set 10 passes.

The strip 210 extends along its length through the cell 216 and the moving member 214 is able to move the strip 210 parallel to its length. More specifically, the moving member 214 comprises fingers 218 that are able to interact with the holes 29 in order to drive the strip 210.

The cell 216 comprises a bath 217 of a material corresponding to the material forming the fifth layer F.

The setup 200 also comprises a masking member 220, such as a masking belt, positioned facing each second side 20 and able to mask each second side 20 with respect to the bath 217, in order to avoid all contact between the bath 217 and each second side 20, i.e. each second electrical circuit 34.

The current generator, also referred to as the power supply source 212, and the masking belt 220 allows the complete electrolytic deposition of the fifth layer F on each first electrical circuit 32 while avoiding the deposition of the fifth layer F on the second circuit 34.

A similar setup is used for a subsequent step 114 of electrodeposition of the sixth layer G of conductive material on the second electrical circuit 34 and inside the first 36 and second 38 orifices. This setup is configured to mask, via a masking member that is similar to the masking belt 220, each first side 16.

Steps 112, 114 of electrodeposition of the fifth F and sixth G layers are carried out via the connection of the power supply lines 28a, 28b to the power supply source 212, the third and fourth layers D and E that are placed in the first 36 and second 38 orifices ensuring the transfer of current to the second electrical circuit 34 for the electrodeposition of the sixth layer G. Thus, steps 112, 114 of electrodeposition of the fifth F and sixth G layers are carried out via the connection of the circuits 32 and 34 to the power supply source 212 only on the side of the circuit 32.

Subsequent to step 114 of electrodeposition of the sixth layer G, the first electrical circuit 32 and the second electrical circuit 34 are connected via the first 36 and second 38 orifices and the third D, fourth E and sixth G layers that are placed in the first 36 and second 38 orifices.

More generally, the electrical power supply lines 28a, 28b are electrically connected, on the one hand, to each first electrical circuit 32 by means of the branches 32a, 32b and, on the other hand, to each second electrical circuit 34 by means of the third D, fourth E and sixth G layers that are placed in the first 36 and second 38 orifices, but also each corresponding first electrical circuit 32 and the branches 32a, 32b.

During the fixation of the chip 51 to the second side 20 and, more specifically, the connection of the chip 51 to the corresponding connecting lands 50, electrical lines of the first circuit 32 that allow the contact lands 40 to be mutually connected are removed in order to electrically isolate the various contact lands 40 and hence, as a consequence, the connecting lands 50, as well as the connection points 44, 46.

The use of the third layer D allows the first 36 and second 38 orifices to be electrically sensitized and makes it possible to do away with the use of a power supply line, analogous to the lines 28a, 28b, on the side 18 and hence on each second side 20. For example, the use of the layers that are present in the first 36 and second 38 orifices as electrical conductors between the first electrical circuit 32 and the second electrical circuit 34 makes it possible, for the electrodeposition of the sixth layer G, to do away with the use of an electrical power supply line 28a, 28b on the second side 20. However, if the second side comprised an electrical line analogous to the lines 28a, 28b, then during the electrodeposition of the sixth layer G, the sixth layer G would be deposited on this line, which would thereby entail additional cost in material, in this instance gold.

The manufacturing cost of the chip supports 12 and hence of the set 10 is thereby reduced, as the quantity of gold used is reduced, knowing that the thickness of the sixth layer G is greater than the thickness of the fifth layer F.

The connection of the chip 52 to the connecting lands 50 is made easier, as the connecting lands 50 are electrically connected to the orifices 32 and their form is optimized in order that they are as close as possible to pins for connecting the chip to the second circuit 34, i.e. to the connecting lands 50. This allows the space between the connection pins and the connecting lands 50, and hence the volume occupied by the wires 54 connecting pins to the corresponding connecting lands 50, to be reduced. Additionally, the sizes of the first 36 and second 38 orifices are reduced as, in comparison with the supports 502 of the prior art, no wire passes through these orifices. Thus, the surface area occupied by the second circuit 34 is reduced, thereby allowing the manufacturing of chip supports 12 whose first side 16, and likewise the second side 20, form a quadrilateral, and for which the shortest edge of the quadrilateral has a length that is equal to 9.5 mm with a margin of error of 2%.

Figure 9:
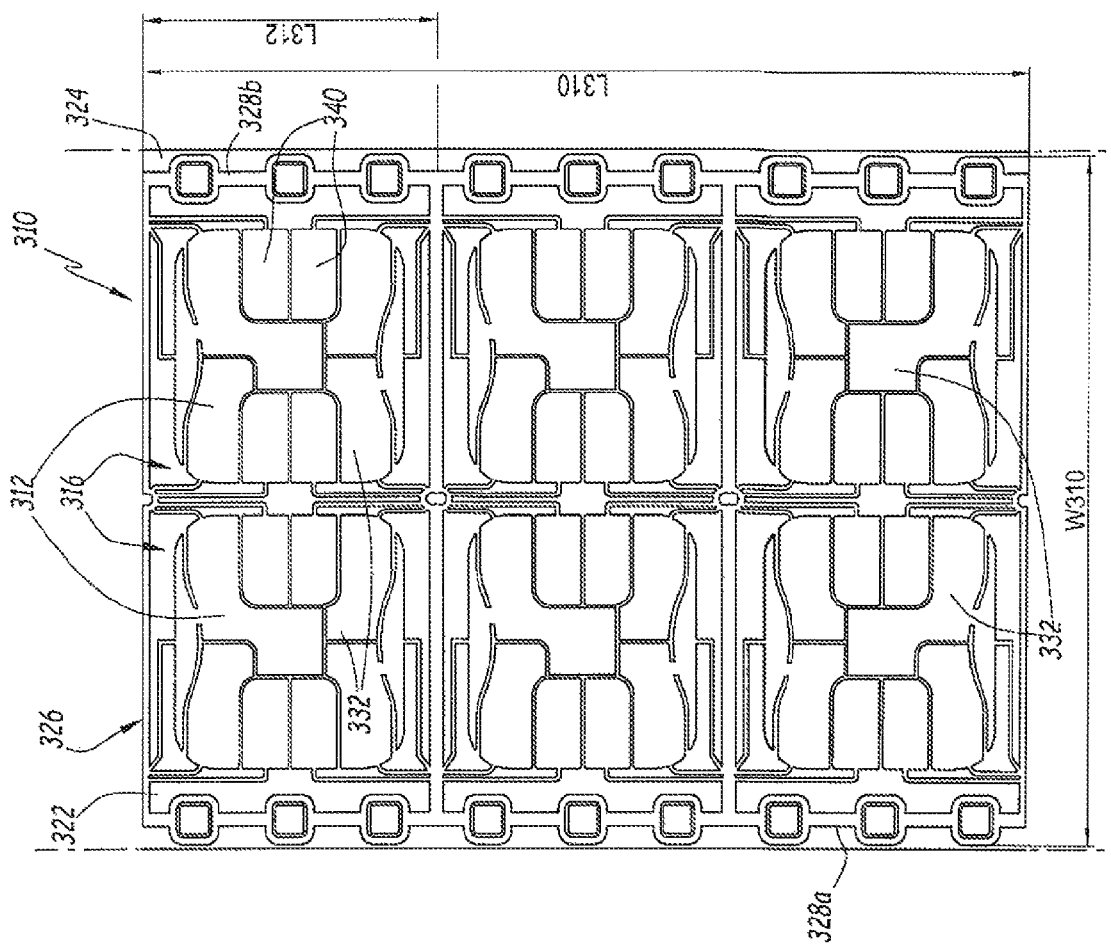
FIG. 9 is a partial plan view, analogous to FIG. 1, of a first side of a set of chip supports in accordance with a second embodiment of the invention.
Figure 10:
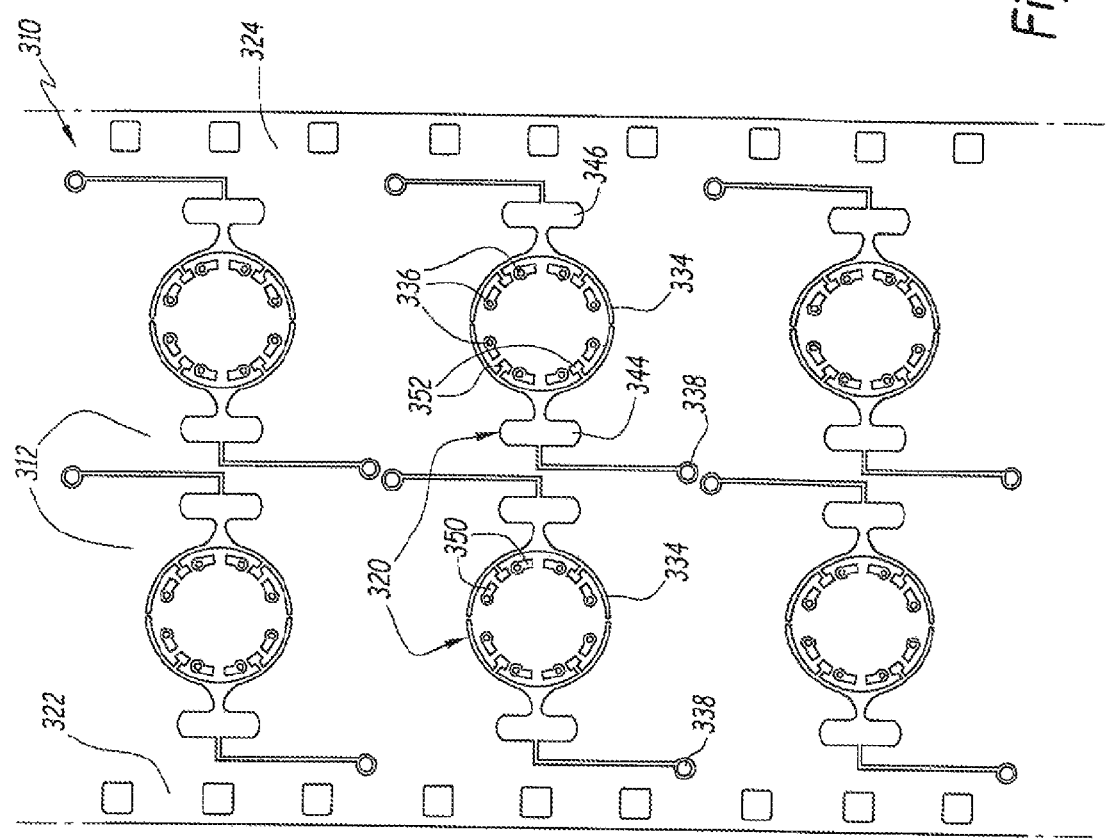
FIG. 10 is a partial plan view, analogous to FIG. 2, of a second side, opposite the first side, of the set of chip supports of FIG. 9.
Figure 11:
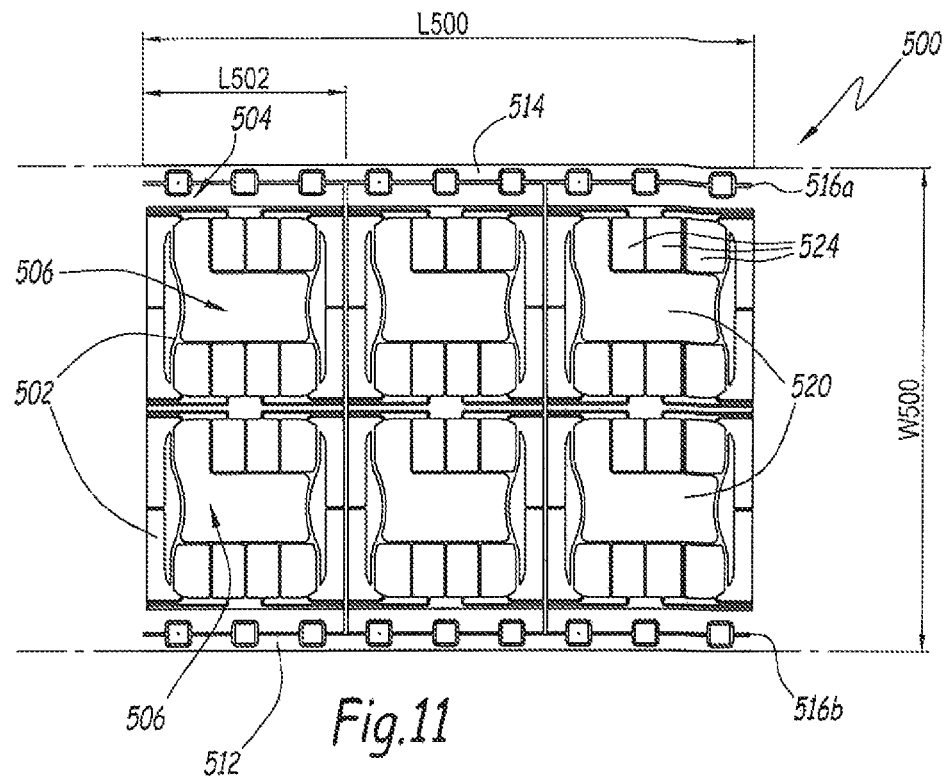
FIG. 11 is a partial plan view of a first side of a set of chip supports in accordance with the prior art.
Figure 12:
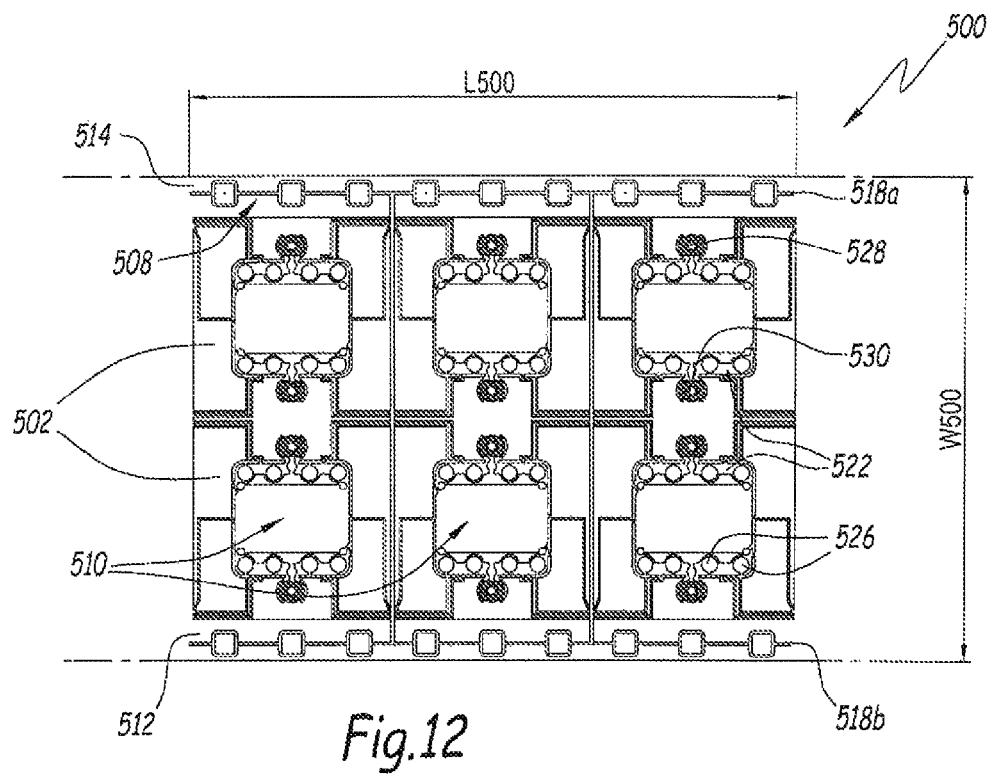
FIG. 12 is a partial plan view of a second side, opposite the first side, of the set of chip supports of FIG. 11.

In the second embodiment shown in FIGS. 9 and 10, the elements that are similar to those of the first embodiment bear the same references but with the addition of 300. A set 310 of chip supports thus comprises six chip supports 312. The first and second embodiments are, on the whole, similar. Thus, the set 310 forms a strip that comprises, along the width W310 of the set 310, rows of two supports 312 that are arranged one after the other along the length L310 of the set 310. Each support 312 comprises a first 316 and a second 320 side and a wafer 326 that forms the first 316 and second 320 sides.

Electrical power supply lines 328a, 328b are positioned on either side of the chip supports 312 at the level of longitudinal edges 322, 324 on the sides 316.

Each first side 316 comprises a first electrical circuit 332 and each second side 320 a second electrical circuit 334. The electrical power supply lines 328a, 328b are electrically connected to the first electrical circuit 332 and, via conductive layers that are placed in first 336 and second 338 orifices, to the second electrical circuit 334.

The length L312 of each support, measured along the power supply lines 328a, 328b is equal to 14.25 mm. In this embodiment, the size of the support is therefore similar to the size of the chip supports 502 of the prior art and differs to that of the supports 12 of the first embodiment.

Additionally, each first circuit 332 comprises contact lands 340. Each second circuit 334 comprises points for connection 344, 346 to an RF antenna and connecting lands 350 and points 352.

The method for manufacturing the chip supports 312 is, on the whole, similar to that for the chip supports 12.

The set 310 and, more specifically, the chip supports 312 allow the quantity of gold used in the manufacturing of the supports 312 to be reduced, as explained for the first embodiment. This reduction in the quantity of gold used allows the manufacturing cost to be reduced.

In a variant, each second side 20 or 320 comprises power supply lines that are analogous to the power supply lines 28a, 28b, 328a, 328b.

According to another variant, each first side 16 or 316 does not comprise any power supply lines and only each second side 20 or 320 comprises power supply lines that are analogous to the power supply lines 28a, 28b, 328a, 328b.

According to another variant, each first side 16 comprises a single power supply line that is connected to the corresponding first circuit 32.

According to another variant, the set of chip supports 10 or 310 comprises, along its width, more than two chip supports.

The features of the embodiments and variants that are envisaged above may be mutually combined.

The invention claimed is:

1. A method for manufacturing at least one electronic chip support, the support being manufactured on the basis of a wafer comprising:
   a first side intended to be in contact with a chip reader;
   a second side, opposite the first side, covered by a first layer of electrically conductive material and intended to be connected to an RF antenna; and
   a core made of an electrically insulating material separating the first side from the second side;
   this method comprising the following steps:
   a) the drilling of at least one through-orifice through the wafer, along a direction that is perpendicular to the wafer;
   b) the deposition of a second layer of conductive material on the first side, the second layer being suitable for covering the orifice or orifices; and
   c) the chemical etching of first and second electrical circuits on the first side and the second side, respectively;
   characterized in that the method comprises, prior to the chemical etching step, the following step:
   b1) the deposition of a third layer of electrically conductive material in the orifice or orifices, the third layer being made of an electrically conductive material that is suitable for covering the electrically insulating material of the core in the corresponding orifice or orifices, the third layer of conductive material electrically connecting, subsequent to the chemical etching step c), the first and the second electrical circuits.

2. The method as claimed in claim 1, characterized in that, subsequent to the deposition step b) and prior to the chemical etching step c), the method comprises the following step:
   b2) the electrodeposition of a fourth layer of electrically conductive material on the second side and inside each orifice, via the connection of only one of the two sides to an electrical power supply source.

3. The method as claimed in claim 1, characterized in that, subsequent to the etching step, the method comprises the following steps:
   d) the electrodeposition of a fifth layer of electrically conductive material on the first side;
   e) the electrodeposition of a sixth layer of electrically conductive material on the second side;
   and in that the steps of electrodeposition of the fifth and sixth layers are carried out via the connection of the first and the second electrical circuits to an electrical power supply source only on the side of the first electrical circuit.

4. The method as claimed in claim 3, characterized in that in the step of electrodeposition of the fifth layer, a first single-sided electrolysis is carried out, the second side being masked by a first masking member, and in that in the step of electrodeposition of the sixth layer, a second single-sided electrolysis is carried out, the first side being masked by a second masking member.

5. The method as claimed in claim 3, characterized in that, subsequent to the deposition step b) and prior to the chemical etching step c) the method comprises the following step:
   b2) the electrodeposition of a fourth layer of electrically conductive material on the second side and inside each orifice, via the connection of only one of the two sides to an electrical power supply source,
   and further characterized in that, prior to the electrodeposition of the fifth and of the sixth layer, a layer of nickel is electrodeposited on at least one of the third and fourth layers.

6. The method as claimed in claim 1, characterized in that the third layer is made of a carbon-based material.

7. The method as claimed in claim 3, characterized in that the fifth and sixth layers of electrically conductive material are made of a gold-based material.

8. The method as claimed in claim 1, characterized in that, in the drilling step, first and second orifices are drilled, the first orifices being drilled in the vicinity of a land or lands for contact of the chip reader with the first side, and the second orifices being drilled outside the contact land or lands, and in that, subsequent to the etching step, the second electrical circuit comprises two points for connection to the RF antenna and an electrical continuity is maintained between each second orifice and the corresponding connection point.

9. The method as claimed in claim 2, characterized in that, in the drilling step, first and second orifices are drilled, the first orifices being drilled in the vicinity of a land or lands for contact of the chip reader with the first side, and the second orifices being drilled outside the contact land or lands, and in that, subsequent to the etching step, the second electrical circuit comprises two points for connection to the RF antenna and an electrical continuity is maintained between each second orifice and the corresponding connection point, and further characterized in that, subsequent to the etching step, the second electrical circuit comprises a land or lands for connecting with the chip, each connecting land being electrically connected, via the fourth layer, to a corresponding first orifice.

10. An electronic chip support, this support comprising a wafer comprising:
    at least one orifice passing through the wafer, along a direction that is perpendicular to the wafer;
    a first side comprising a first electrical circuit and intended to be in contact with a chip reader, the first electrical circuit covering the orifice or orifices on the first side;
    a second side, opposite the first side, comprising a second electrical circuit and intended to be connected to an RF antenna;
    a core made of an electrically insulating material separating the first side from the second side;
    wherein a layer of electrically conductive material is placed in the orifice or orifices, the layer of electrically conductive material covering the electrically insulating material in the corresponding orifice or orifices and electrically connecting the first circuit and the second circuit, and wherein the second electrical circuit comprises a land or lands for connecting with a chip fixed to the second side, each connecting land being electrically connected to a corresponding orifice.

11. The support as claimed in claim 10, characterized in that the first side forms a quadrilateral and in that the shortest edge of the quadrilateral has a length that is equal to 9.5 mm with a margin of error of 2%.

12. A set of chip supports, the set comprising, along its width, two edges and at least two chip supports between the two edges, characterized in that the chip supports are as claimed in claim 10.

13. The set as claimed in claim 12, characterized in that the set comprises, solely on one side, corresponding to the first or to the second side, at least one electrical power supply line extending along the length of the set and electrically connected to each corresponding electrical circuit, either by means of branches or by means of at least one layer of electrically conductive material placed in the orifice or orifices.

* * * * *